(12) United States Patent
Jansson (10) Patent No.: US 7,902,893 B1
(45) Date of Patent: Mar. 8, 2011

(54) CLOCK-SIGNAL GENERATOR

(75) Inventor: Christer Jansson, Linköping (SE)

(73) Assignee: Zoran Corporation, Sunnyvale, CA (US)

( * ) Notice: Subject to any disclaimer, the term of this patent is extended or adjusted under 35 U.S.C. 154(b) by 7 days.

(21) Appl. No.: 12/620,149

(22) Filed: Nov. 17, 2009

(51) Int. Cl.
*H03K 5/12* (2006.01)

(52) U.S. Cl. .................... 327/175; 327/172; 327/176

(58) Field of Classification Search .................. None
See application file for complete search history.

(56) References Cited

U.S. PATENT DOCUMENTS

| | | | |
|---|---|---|---|
| 5,537,069 A * | 7/1996 | Volk | 327/149 |
| 6,084,453 A | 7/2000 | Fuse et al. | |
| 6,150,847 A | 11/2000 | Lu | |
| 6,930,525 B2 * | 8/2005 | Lin et al. | 327/161 |
| 7,126,396 B1 | 10/2006 | Courcy | |
| 2004/0085111 A1 | 5/2004 | Yi | |
| 2006/0044037 A1 | 3/2006 | Gomm et al. | |
| 2006/0227861 A1 | 10/2006 | Maksimovic | |

FOREIGN PATENT DOCUMENTS

EP      0 522 274 A      1/1993

OTHER PUBLICATIONS

European Search Report, corresponding to EP 08 15 6869, date of completion of the search Aug. 14, 2008.

* cited by examiner

*Primary Examiner* — An T Luu
(74) *Attorney, Agent, or Firm* — Lando & Anastasi, LLP (57) ABSTRACT

A clock-signal generating unit for generating an output clock signal with a controlled duty cycle based on an input clock signal. The clock-signal generating unit comprises one or more delay lines arranged to generate a plurality of mutually delayed output signals at different positions within the delay line based on the input clock signal. A control unit is arranged to detect a position within one of the delay lines, the output signal of which has a delay, with respect to the input clock signal, that is essentially equal to one period of the input clock signal, and generate an output signal that indicates the detected position. A selection unit is arranged to generate a delayed clock signal that has a delay, with respect to a signal associated with the input clock signal, that is essentially equal to a period of the clock signal multiplied with said duty cycle based on output signals from one of the delay lines and the output signal of the control unit. The clock-signal generating unit comprises circuitry for generating the output clock signal based on the signal associated with the input clock signal and the delayed clock signal. A corresponding method of generating an output clock signal with a controlled duty cycle based on an input clock signal is also disclosed.

14 Claims, 8 Drawing Sheets

CLOCK-SIGNAL GENERATOR

TECHNICAL FIELD

The present invention relates to a clock-signal generator and method for generating a clock signal. More particularly, the present invention relates to a clock-signal generator and method for generating a clock signal with a controlled duty cycle.

BACKGROUND

In order to control and/or synchronize operations in an electronic circuit, a clock signal may be used. The clock signal may e.g. be generated externally outside of a semiconductor chip comprising the electronic circuit or parts thereof, e.g. by means of a crystal oscillator. As another example, the clock signal may be generated internally on the chip, e.g. by means of a phase-locked loop (PLL).

Some circuits may require a clock signal with a relatively well-defined or controlled duty cycle, i.e. the relative portion of a clock cycle during which the clock signal is high. As a nonlimiting example, a resettable comparator circuit may be used e.g. in an analog-to-digital converter (ADC). The comparator circuit may e.g. be arranged to compare an input voltage of the ADC, or a voltage derived therefrom, with a reference voltage of the ADC. The comparator circuit may be arranged to be reset between consecutive comparisons. The clock signal may be used to control the operation of the comparator circuit. For example, the comparator circuit may be arranged to be reset during a "high" state of the clock signal (i.e. corresponding to a logic '1') and to be operative to perform a comparison during a "low" state of the reset signal (i.e. corresponding to a logic '0').

In order for the comparator to be properly reset, a certain amount of reset time may be needed. On the other hand, in order to perform a comparison and output a correct result, a certain amount of comparison time may be needed. If the reset time is too short, the result of the subsequent comparison may be influenced not only by the input voltages to the comparator, but also by previous comparisons. Furthermore, the input voltages to the comparator might not be given enough time to settle before the subsequent comparison is to be performed. On the other hand, if the comparison time is to short, the comparator may not be able to make a decision, especially if the difference between the input voltages is relatively small. For such a comparator circuit, there may be an optimum or near-optimum trade-off between reset time and comparison time, which translates to an optimum or near optimum duty cycle for the clock signal.

The duty cycle of a clock signal generated externally or internally, e.g. by means of a crystal oscillator, PLL, or the like, may have a different duty cycle than the desired duty cycle. Alternatively or additionally, the duty cycle may vary between chips and/or in time, e.g. due to temperature variations and aging of components.

Hence, there is a need for means for generating a clock signal with a well-defined or controlled duty cycle.

SUMMARY

It is an object of the present invention to provide for generation of a clock signal with a controlled duty cycle.

According to a first aspect, a clock-signal generating unit for generating an output clock signal with a controlled duty cycle based on an input clock signal is provided. The clock-signal generating unit comprises at least one delay line arranged to generate a plurality of mutually delayed output signals at different positions within the delay line based on the input clock signal. Furthermore, the clock-signal generating unit comprises a control unit arranged to detect a position within one of the at least one delay line, the output signal of which has a delay, with respect to the input clock signal, that is essentially equal to one period of the input clock signal. The control unit is further arranged to generate an output signal that indicates the detected position. Moreover, the clock-signal generating unit comprises a selection unit arranged to generate a delayed clock signal that has a delay, with respect to a signal associated with the input clock signal, that is essentially equal to a period of the clock signal multiplied with said duty cycle based on output signals from one of the at least one delay line and the output signal of the control unit. In addition, the clock-signal generating unit comprises circuitry for generating the output clock signal based on the signal associated with the input clock signal and the delayed clock signal.

The circuitry for generating the output clock signal may be an SR latch. The SR latch may be arranged to receive the signal associated with the input clock signal on a set input terminal of the SR latch and the delayed clock signal on a reset input terminal of the SR latch.

The control unit may comprise a plurality of D flip-flops. Each of the D flip-flops may be arranged to receive a unique one of the mutually delayed output signals on a data input terminal and to be clocked with the input clock signal. The control unit may be arranged to generate the output signal that indicates the detected position based on output signals from the D flip-flops.

The control unit may be arranged to detect said position within a first delay line of said at least one delay line. The selection unit may be arranged to generate said delayed clock signal based on output signals from a second delay line of the at least one delay line. The second delay line may be another delay line than the first delay line. Alternatively, the control unit may be arranged to detect said position within a first delay line of said at least one delay line and the selection unit may be arranged to generate said delayed clock signal based on output signals from the same first delay line.

The duty cycle may be a fixed predetermined duty cycle. Alternatively, the duty cycle may be variable, e.g. by means of reconfiguring the selection unit and/or by means of varying a delay of the second delay line with respect to a delay of the first delay line.

The signal associated with the clock signal may e.g. be the clock signal. According to a second aspect, an analog-to-digital converter comprises the clock-signal generating unit according to the first aspect.

According to a third aspect, an integrated circuit comprises the clock-signal generating unit according to the first aspect.

According to a fourth aspect, an electronic apparatus comprises the clock-signal generating unit according to the first aspect. The electronic apparatus may e.g. be, but is not limited to, any of a television set, a liquid-crystal display, a computer monitor, a digital camera, a projector, and a radio receiver.

According to a fifth aspect, a method of generating an output clock signal with a controlled duty cycle based on an input clock signal is provided. According to the method, at least one set of mutually delayed signals is generated based on the input clock signal. Furthermore, a signal is detected within one of the at least one sets that has a delay, with respect to the input clock signal, that is essentially equal to one period of the input clock signal. Moreover, an indication signal that identifies the detected signal is generated. A delayed clock signal is generated that has a delay, with respect to a signal associated with the input clock signal, that is essentially equal to a period of the input clock signal multiplied with said duty cycle based on signals from one of the at least one set and the indication signal. The output clock signal is generated based on the signal associated with the input clock signal and the delayed clock signal.

Further embodiments of the invention are defined in the dependent claims.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of the invention will appear from the following detailed description of the invention, reference being made to the accompanying drawings, in which.

DETAILED DESCRIPTION

Figure 1:
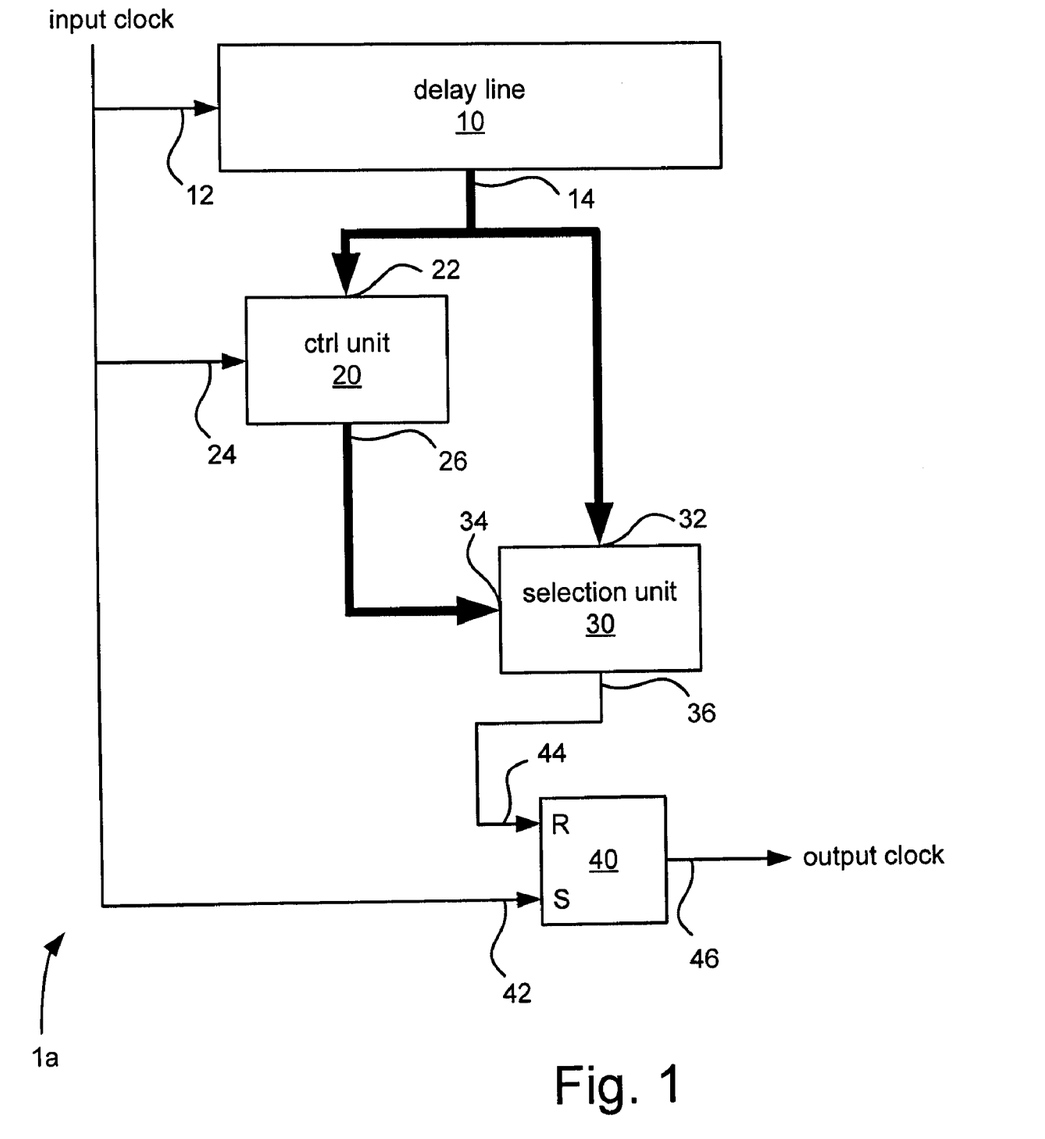
FIGS. 1-2 are block diagrams of clock-signal generating units according to embodiments.

FIG. 1 is a block diagram of a clock-signal generating unit 1a according to an embodiment. The clock-signal generating unit 1a is arranged to generate an output clock signal with a controlled duty cycle. The generation of the output clock signal is based on an input clock signal. The input clock signal may, according to embodiments, have a relatively stable frequency. As nonlimiting examples, the input clock signal may be generated directly by a crystal oscillator or a phase-locked loop (PLL) locked to the frequency of a crystal oscillator. The duty cycle of the input clock signal is not critical and may e.g. vary in time, between chips, etc.

According to the embodiment, the clock-signal generation unit 1a comprises a delay-line 10. The delay line 10 is arranged to receive the clock signal on a clock input terminal 12 of the delay line 10. Furthermore, the delay line 10 is arranged to generate a plurality of mutually delayed output signals at different positions within the delay line 10 based on the input clock signal. The mutually delayed output signals are output on individual output terminals of an output port 14 of the delay line 10.

The delay line 10 may comprise a plurality of delay elements. The delay elements may be connected in cascade, and the mutually delayed output signals may be generated between individual delay elements. This will be further described in the context of FIG. 3. The delay elements may be designed to have a certain nominal delay. The delay for manufactured circuits may differ from this nominal value. The delay may also vary between different semiconductor chips and/or in time, e.g. due to temperature variations and/or aging of components. However, using an appropriate circuit-layout approach, the delay for delay elements on the same chip may be relatively well matched.

According to the embodiment illustrated in FIG. 1, the clock-signal generation unit 1a comprises a control unit 20. According to the embodiment, the control unit 20 has a clock terminal 24 for receiving the clock signal. Furthermore, the control unit 20 has an input port 22 for receiving at least some of the mutually delayed output signals from the delay line 10. The control-unit 20 is arranged to detect a position within the delay line 10, the output signal of which has a delay, with respect to the input clock signal, which is essentially equal to one period of the input clock signal. Furthermore, the control unit 20 is arranged to generate an output signal that indicates the detected position. The output signal may e.g. be a multi-bit word output on an output port 26 of the control unit 20. The detected position can be regarded as a measure of the delay of delay elements in the delay line 10 relative to the period of the input clock signal.

Furthermore, according to the embodiment illustrated in FIG. 1, the clock-signal generation unit 1a comprises a selection unit 30. According to the embodiment, the selection unit 30 is arranged to receive at least some of the mutually delayed output signals from the delay line 10 on an input port 32. Furthermore, the selection unit 30 is arranged to receive the output signal from the control unit 20 on an input port 34 of the selection unit 30. The selection unit 30 is, according to the embodiment, arranged to generate a delayed clock signal. The delayed clock signal may e.g. be generated on an output terminal 36 of the selection unit 30. Said delayed clock signal has a delay, with respect to a signal associated with the input clock signal, that is essentially equal to a period of the clock signal multiplied with the desired duty cycle. For the embodiment illustrated in FIG. 1, the signal associated with the input clock signal is the input clock signal itself. According to other embodiments, the signal associated with the input clock signal may be a signal with the same frequency as the input clock signal, and which may e.g. be synchronized with the input clock signal or have a known delay with respect to the input clock signal.

The generation of the delayed clock signal in the selection unit 30 may be based on the mutually delayed output signals from the delay line 10 and the output signal of the control unit 20. For example, the selection unit 30 may be adapted to select and output one of the mutually delayed output signals from the delay line 10 based on the output signal of the control unit 20.

In the following, an illustrative example is given to qualitatively describe how the mutually delayed output signals from the delay line 10 and the output signal of the control unit 20 may be utilized for generating the delayed clock signal. In the following, it is assumed that the delay between two neighboring positions in the delay line 10 is approximately equal throughout the delay line 10. Assume that the control unit 20 has detected that the output signal from the tenth position in the delay line 10 has a delay approximately equal to one clock cycle of the input clock signal with respect to the input clock signal. Then, referring to the clock input node of the delay line 10 as position zero, the output signal form the first position of the delay line 10 has a delay with respect to the input clock signal of approximately 10% of a clock cycle of the input clock signal. Similarly, the output signal from the second position has a delay with respect to the input clock signal approximately equal to 20% of a clock cycle of the input clock signal, the output signal from the third position has a delay with respect to the input clock signal approximately equal to 30%, etc.

The selection unit 30 may, e.g. by means of table look up, select one of the mutually delayed output signals from the delay line 10 that would result in a delayed clock signal having a delay, with respect to the signal associated with the input clock signal, that has the closest correspondence with the desired duty cycle. Note that, in the design of a clock-signal generation unit according to embodiments presented herein, it may be necessary to take into account not only the delays within the delay lines, but also delays in other circuitry, such as the selection unit 30, clock buffers, etc. If, for the example discussed above, a 30% duty cycle is desired, it may, for example, be necessary to select the output signal from the second position of the delay line 10 (which only has a 20% delay with respect to the input clock signal) as a basis for the generation of the delayed clock signal due to delay within the selection unit 30. Similar considerations may be appropriate e.g. if there is a mutual delay between the input clock signal and the signal associated with the input clock signal. Appropriate selection among the mutually delayed output signals from the delay line 10 as a basis for the generation of the delayed clock signal for a given duty cycle may e.g. be derived through simulation in a circuit simulator and/or through measurements.

The clock-signal generation unit 1*a* further comprises circuitry 40 for generating the output clock signal based on the signal associated with the input clock signal and the delayed clock signal. In the embodiment illustrated in FIG. 1, said circuitry is an SR-latch. The signal associated with the clock signal is supplied to a set (S) input terminal 42 of the SR-latch 40. Furthermore, the delayed clock signal generated by the selection unit 30 is supplied to a reset (R) input terminal 44 of the SR latch 40. The output clock signal is generated on an output terminal 46 of the SR latch 40. The SR latch 40 may be edge triggered. For example, the SR-latch 40 may e.g. be arranged to be reset on a rising edge of the signal input on the R input terminal and to be set on a rising edge of the signal input on the S input terminal. Alternatively, the SR-latch 40 may e.g. be arranged to be reset on a falling edge of the signal input on the R input terminal and to be set on a falling edge of the signal input on the S input terminal.

Figure 2:
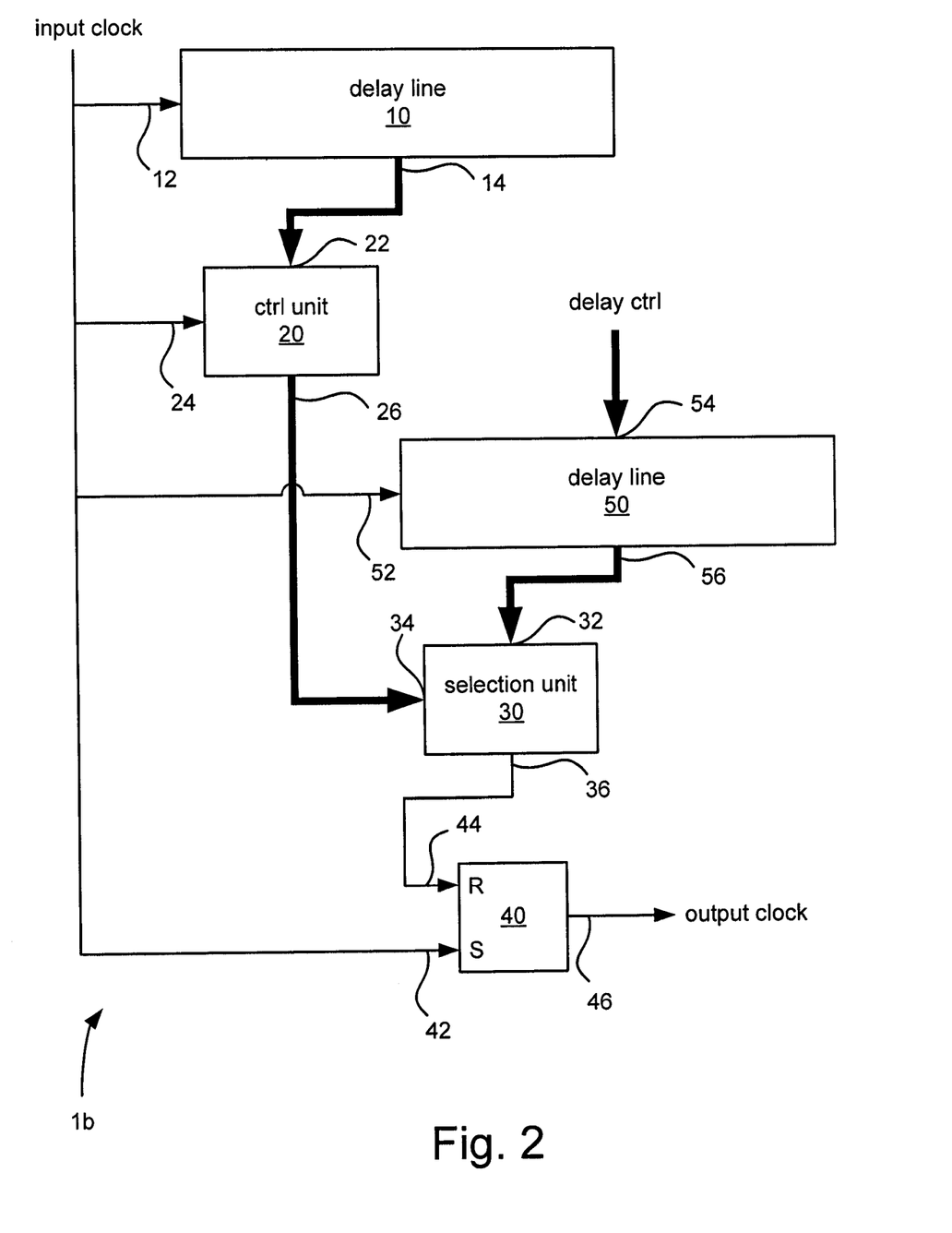

According to some embodiments, a clock-signal generating unit may comprise more than one delay line. FIG. 2 is a block diagram of a clock-signal generating unit 1*b* according to embodiment. Units that have the same or similar function as the corresponding units in FIG. 1 are denoted with the same reference numerals as in FIG. 1. These elements are not described in further detail in the context of FIG. 2.

In addition to the delay line 10, the clock-signal generating unit 1*b* according to the embodiment illustrated in FIG. 2 comprises another delay line 50. The delay line 50 is arranged to receive the clock signal on a clock input terminal 52 of the delay line 50. Furthermore, the delay line 50 is arranged to generate a plurality of mutually delayed output signals at different positions within the delay line 50 based on the input clock signal. The mutually delayed output signals are output on individual output terminals of an output port 56 of the delay line 50.

A difference between the embodiments illustrated in FIGS. 1 and 2 is that, for the embodiment of the clock-signal generating unit 1*b* in FIG. 2, the selection unit 30 is arranged to generate the delayed clock signal based the mutually delayed output signals from the delay line 50 instead of the mutually delayed output signals from the delay line 10.

The delay line 50 may e.g. be implemented in the same or a similar way as the delay line 10. For example, the delay line 50 may e.g. be implemented with delay elements having the same delay as delay elements in the delay line 10. Alternatively, the delay of the delay elements in the delay line 50 may have a different delay than the delay elements in the delay line 10. As nonlimiting examples, the delay elements in the delay line 50 may be designed to have 50% or 75% of the delay of the delay elements in the delay line 10. A suitable relationship between the delay of the delay elements in the delay line 10 and the delay of the delay elements in the delay line 50 may e.g. be decided for each application in which the clock signal generating unit 1*b* is to be used based on requirements of the application. Even though the delay of delay elements may differ from a nominal value intended during the design of the circuit, and also vary between chips and in time, the delay elements on the same chip can normally be designed to be relatively well matched in terms of the quotient between their delays, e.g. using an appropriate circuit-layout approach. The delay of a delay element can e.g. be altered by altering a current-driving capability of a transistor in the delay element and/or altering a load capacitance of the delay element. The current-driving capability of a transistor may, e.g. in the case of an MOS transistor, be altered by altering the width-over-length (W/L) ratio of the transistor. Suitable relations between the delays for the delay elements in the delay lines 10 and 50 may e.g. be determined separately for each implementation based on requirements imposed by applications in which the clock-signal generating unit 1*b* is to be used.

According to some embodiments, the clock-signal generating unit 1*a* (FIG. 1) or 1*b* (FIG. 2) may be adapted to generate the output clock signal with a fixed predetermined duty cycle.

According to other embodiments, the clock-signal generating unit 1*a* (FIG. 1) or 1*b* (FIG. 2) may be adapted to generate the output clock signal with a variable duty cycle. The duty cycle may e.g. be varied based on control signals supplied from a circuit that utilizes the output clock signal for its operation and that e.g. requires different duty cycles in different modes of operation.

According to some embodiments, the duty cycle of the clock-signal generating unit 1*b* (FIG. 2) may be variable by means of varying the delay of delay elements in the delay line 50 with respect to the delay of delay elements in the delay line 10. This indicated in FIG. 2, where the delay line 50 has an input port 54 for receiving a delay-control signal for controlling the delay of delay elements in the delay line 50. Alternatively or additionally, the delay line 10 may be arranged to receive a delay-control signal for controlling the delay of delay elements in the delay line 10.

According to some embodiments, the duty cycle of the clock-signal generating unit 1*a* (FIG. 1) or 1*b* (FIG. 2) may additionally or alternatively be variable by means of reconfiguring the selection unit 30. For example, the selection unit 30 may be adapted to receive a duty-cycle control signal (not indicated in the Figures) indicating a desired duty cycle. Furthermore, the selection unit 30 may be adapted to perform the selection of one of the mutually delayed output signals from the delay line 10 (FIG. 1) or 50 (FIG. 2) based on the output signal of the control unit 20 differently for different values of the duty-cycle control signal, such that the duty cycle indicated thereby is obtained. Appropriate selection among the mutually delayed output signals from the delay line 10 (FIG. 1) or 50 (FIG. 2) for a given set of selectable duty cycles may e.g. be derived through simulation in a circuit simulator and/or through measurements.

Figure 3:
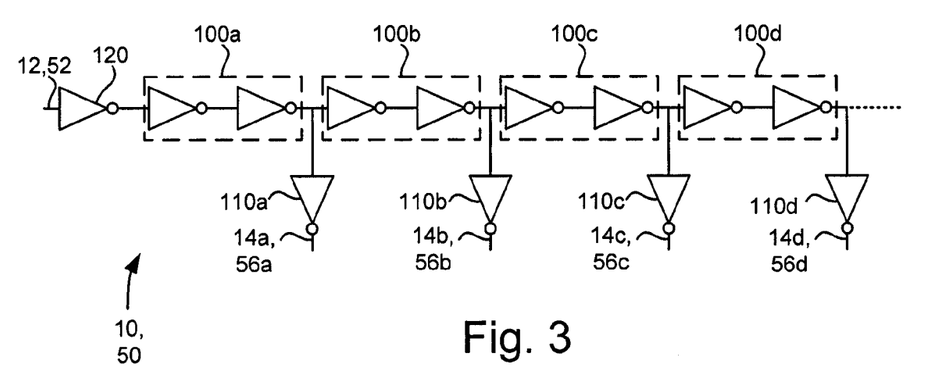
FIG. 3 is a circuit diagram of a delay line according to an embodiment.

FIG. 3 shows a circuit diagram of a delay line according to an embodiment. As indicated in FIG. 3, the delay line may e.g. be the delay line 10 (FIGS. 1 and 2) or the delay line 50 (FIG. 2). According to the embodiment, the delay line comprises a plurality of delay elements 100a-d connected in cascade. Four delay elements 100a-d are shown in FIG. 3, but the delay line may comprise more (or fewer) delay elements, as indicated by the dotted line at the output terminal of the delay element 100d. Each of the delay elements 100a-d comprises two inverters connected in cascade. The number two is only an example. Any number of inverters may be used in the delay elements. The design of circuits that make use of the mutually delayed output signals from the delay line, such as the control unit 20 and/or selection unit 30, is simplified if the number of inverters in each delay element is even. If the number is odd, the output signal from every other position in the delay line is inverted with respect to the other output signals, which in that case needs to be taken into account in the control unit 20 and/or the selection unit 30.

In the embodiment illustrated in FIG. 3, the output signals of the delay line are buffered by means of inverters 110a-d connected between output terminals of the delay elements 100a-d and individual output terminals 14a-d or 56a-d. Thereby, the delay line is to some extent isolated from switching activity in circuits utilizing the output signals from the delay line. Furthermore, the buffer inverters 110a-d make sure that the load capacitance for all delay elements 100a-d is approximately equal. The reference numerals 14a-d denote individual output terminals of the output port 14 for a case where the delay line illustrated in FIG. 3 is the delay line 10 (FIG. 1 or 2). Similarly, the reference numerals 56a-d denote individual output terminals of the output port 56 for a case where the delay line illustrated in FIG. 3 is the delay line 50 (FIG. 2). To compensate for the inversion performed by these inverters, an inverter 120 is connected between the clock input terminal 12 or 52 of the delay line and the input terminal of the first delay element 100a. Alternatively, the inversion provided by the inverters 110a-d may be taken into account in the control unit 20 and/or the selection unit 30.

In order to match the delays of the two inverters in a delay element 100a-d, a dummy-load inverter (not shown) may be connected with its input terminal to the internal node between the two inverters of the delay element 100a-d. The dummy-load inverter may e.g. be identically designed as the inverter 110a-d connected to the output terminal of the delay element 100a-d. Thereby, the load of the two inverters in each delay element 100a-d may be relatively well matched. The dummy-load inverter may help ensure that the delay elements 100a-d delays positive and negative edges approximately equal, and thereby preserve the duty cycle of the signal propagating through the delay line.

According to other embodiments, the output signals of the delay line 10 and/or 50 may be generated directly on the output terminals of delay elements 100a-d, without buffering. According to yet other embodiments, noninverting buffers or buffers with more than one inverter connected in cascade may be used instead of the inverters 110a-d.

Figure 4A:
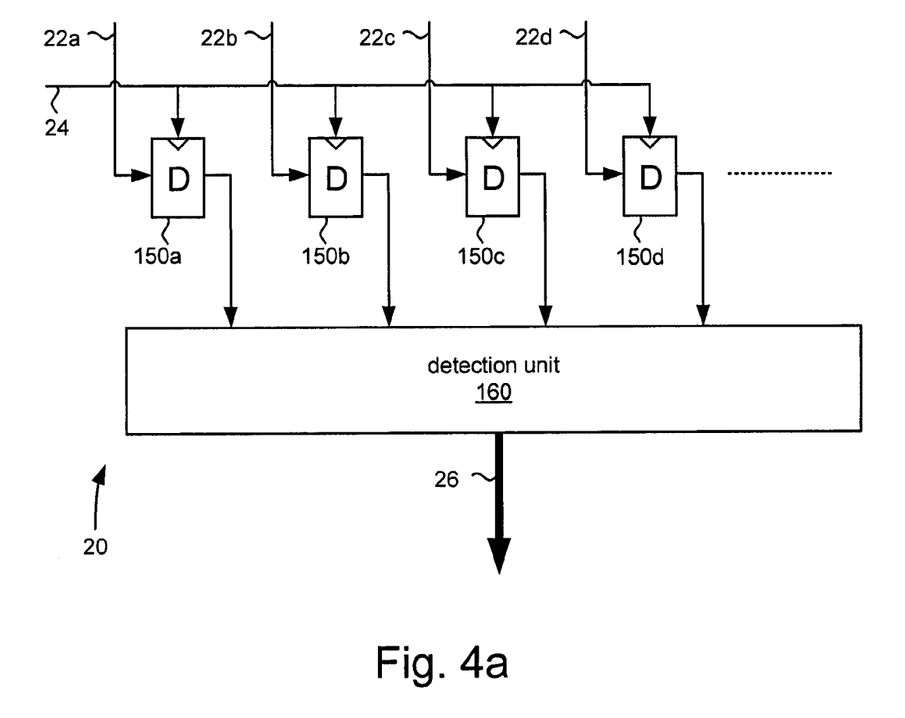
FIGS. 4a and b are block diagrams of control units according to embodiments.

FIG. 4a is a block diagram of the control unit 20 according to an embodiment. According to the embodiment, the control unit 20 comprises a plurality of D flip-flops 150a-d. Data input terminals of the D flip-flops 150a-d are connected to input terminals 22a-d of the control unit 20. The reference numerals 22a-d denote individual input terminals of the input port 22 (FIGS. 1 and 2) of the control unit 20.

Four D flip-flops 150a-d are shown in FIG. 4a, but the control unit may comprise more (or fewer) D flip-flops as indicated by the dotted line in FIG. 4a. Each of the input terminals 22a-d may be connected to a unique one of the output terminals 14a-d of the delay line 10. Hence, each of the D flip-flops 150a-d may be arranged to receive a unique one of the mutually delayed output signals from the delay line 10 on a data input terminal of the D flip-flop 150a-d.

According to some embodiments, each output terminal 14a-d of the delay line 10 is connected to an input terminal 22a-d of the control unit 20. According to other embodiments, only a subset of the output terminals 14a-d of the delay line 10 are connected to input terminals 22a-d of the control unit 20. For example, some of the mutually delayed output signals from the delay line 10 may have too short delay, in relation to the period of the input clock signal, to be relevant as input signal to the control unit 20. Accordingly, the number of input terminals 22a-d of the control unit 20 may, but does not have to be, equal to the number of output terminals 14a-d of the delay line 10.

In the embodiment illustrated in FIG. 4a, each of the D flip-flops 150a-d is arranged to be clocked with the input clock signal. Hence, the output signal from each D flip-flop 150a-d is a "snap shot" of the one of the mutually delayed output signals from the delay line 10 that is input that D flip-flop 150a-d upon the arrival of a triggering edge of the input clock signal. In some embodiments, the triggering edge is a rising edge. In other embodiments, the triggering edge is a falling edge. According to the embodiment, the control unit 20 is arranged to detect the position within the delay line 10 that has a delay, with respect to the input clock signal, essentially equal to one period of the input clock signal and generate the output signal that indicates the detected position based on output signals from the D-flip-flops 150a-d. For example, according to the embodiment illustrated in FIG. 4a, the control unit 20 comprises a detection unit 160, which is adapted to generate the output signal that indicates the detected position based on the output signals from the D flip-flops 150a-d.

An example of how the output signals from the D flip-flops 150a-d may be utilized to detect the position in the delay line 10 that has a delay, which is essentially equal to one period of the input clock signal, is given in the following. In the example, the D flip-flops 150a-d are triggered on rising edges of the input clock signal. A similar description apply, however, for D flip-flips that are triggered on falling edges. In the example, the part of a period of the input clock signal in which the input clock signal is low, or '0', is referred to as the "low phase" of the input clock signal.

For the sake of facilitating the description of the example, the D flip-flops 150a-d are ordered in order of increasing delay of the signal input to the D flip-flop. For example, the first D flip-flop is the D flip-flop whose input signal has the shortest delay (with respect to the input clock signal), the last D flip-flop is the D flip-flop whose input signal has the longest delay, etc.

According to the example, a few of the first D flip-flops have input signals that are delayed with a delay that is shorter than the duration of the low phase of the input clock signals. For these D flip-flops, the output signals are '0', because their input signals are '0' when the rising edge of the input clock signal arrives.

For D flip-flops that have input signals that are delayed with a delay that is longer than the duration of the low phase of the input clock signal but shorter than one period of the input clock signal, the output signals are '1', because their input signals are '1' when the rising edge of the input clock signal arrives.

For the first D flip-flop having an input signal that is delayed with more than one period of the input clock signal, the output signal is '0'. This D flip-flop is the first D flip-flop that fulfills the conditions:

a) the D flip-flop outputs a '0'
b) the preceding D flip-flop outputs a '1'

Accordingly, this D flip-flop, which in the following is referred to as the "detected D flip-flop", can be detected by checking the output signals from the D flip-flops 150a-d with respect to the above conditions a) and b). This check can e.g.

be performed by the detection unit 160. The input signal to the detected D flip-flop has a delay, which is slightly longer than the clock period of the input clock signal. The input signal to the D flip-flop that precedes the detected D flip-flop has a delay, which is slightly shorter than the clock period of the input clock signal. Both of these signals may, according to different embodiments, be considered to have a delay, which is essentially equal to one clock period of the input clock signal.

According to some embodiments, the detected position within the delay line 10, which is indicated in the output signal from the control unit 20, is the position from which the detected D flip-flop receives its input signal. According to other embodiments, the detected position within the delay line 10 is the position from which the D flip-flop that precedes the detected D flip-flop receives its input signal.

Figure 4B:
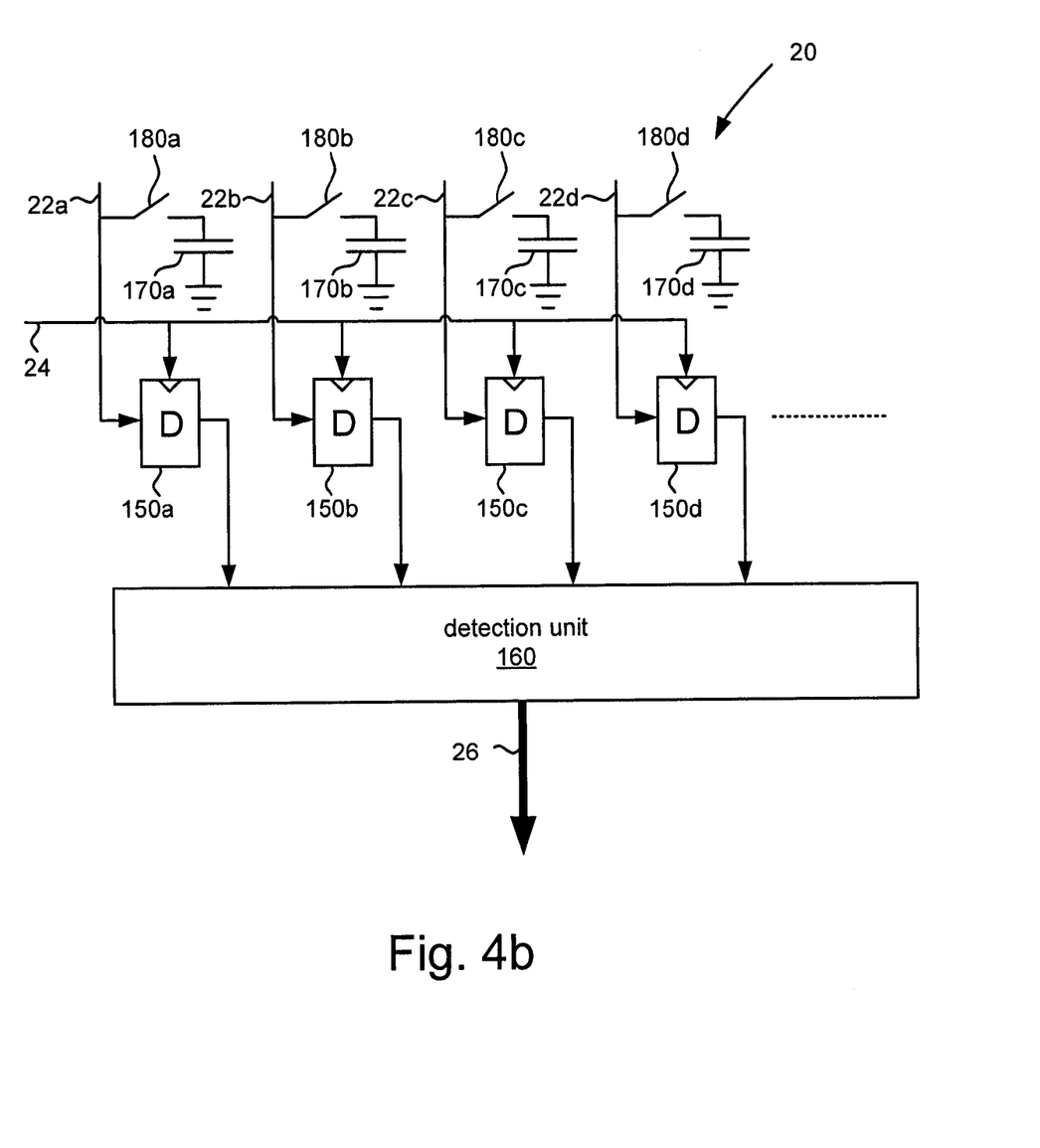

FIG. 4*b* is a block diagram of the control unit 20 according to another embodiment. According to the embodiment, the control unit 20 comprises a plurality of capacitors 170*a*-*d* arranged to be selectively connected to the input terminals 22*a*-*d* of the control unit 20 by means of switches 170*a*-*d*. The switches 170*a*-*d* are arranged to be controlled in response to the output signal of the control unit 20 in such a way that the one of the switches 180*a*-*d* that is connected to the above described detected D flip-flop is closed and the other switches are open. As a consequence, an additional delay is added to the input signal to said detected D flip-flop. Thereby, a "hysteresis" is introduced in the control unit 20, which helps stabilizing the output signal from the control unit 20. For example, toggling between two values (e.g. indicating two neighboring positions within the delay line 10) may be avoided.

Figure 5:
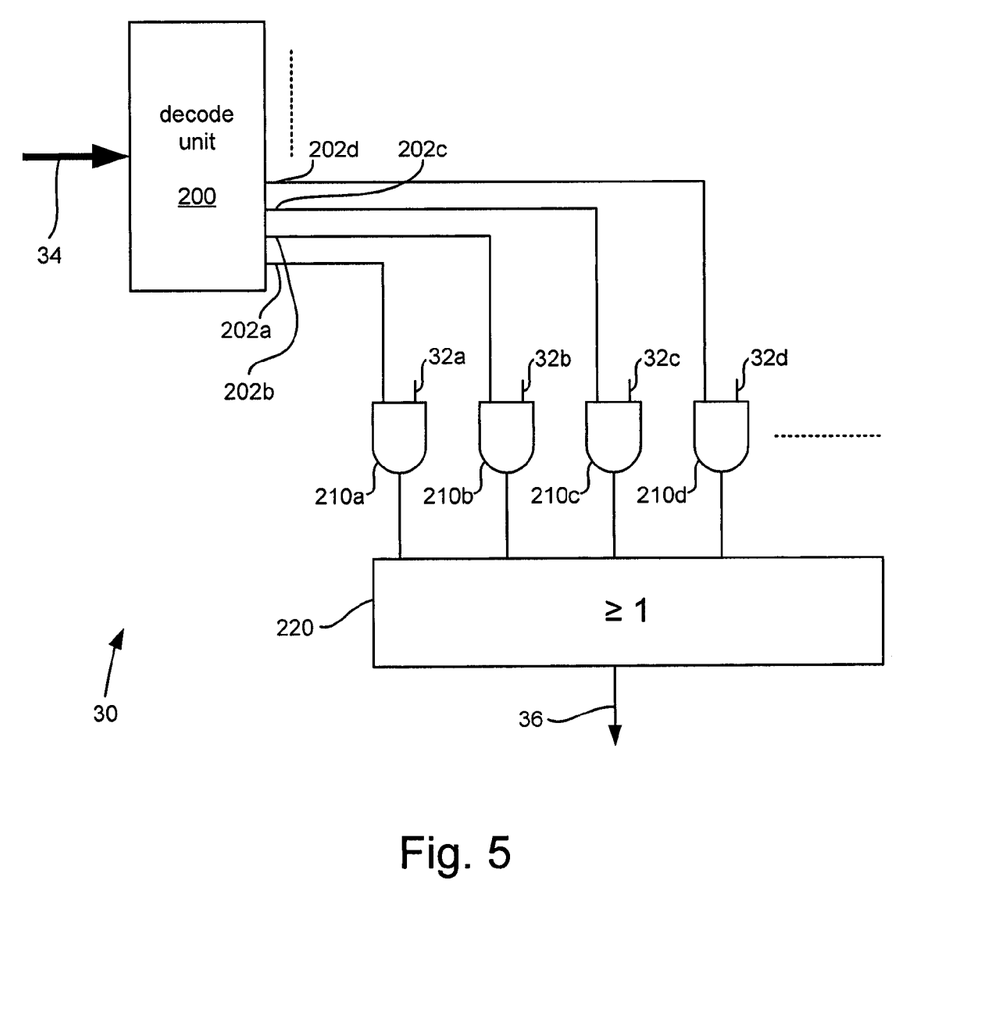
FIG. 5 is a block diagram of a selection unit according to an embodiment.

FIG. 5 is a block diagram of the selection unit 30 according to an embodiment. According to the embodiment, the selection unit 30 comprises a decode unit 200, a plurality of two-input logic gates 210*a*-*d*, and a logic block 220. In FIG. 5, the logic gates 210*a*-*d* are AND gates. However, other gates, such as NAND, OR, or NOR gates may be used as well if the functions of the decode unit 200 and the logic block 220 are properly adjusted. Four AND gates 210*a*-*d* are shown in FIG. 3, but the number of AND gates may be larger (or smaller) than four as indicated by the dotted line in FIG. 5.

One input terminal of each AND gate 210*a*-*d* is arranged to receive a unique one of the mutually delayed output signals from the delay line 10 (FIG. 1) or 50 (FIG. 2). The reference numerals 32*a*-*d* in FIG. 5 denote individual input terminals of the input port 32 (FIGS. 1 and 2) of the selection unit 30. According to some embodiments, each output terminal 14*a*-*d* or 56*a*-*d* of the delay line 10 (FIG. 1) or 50 (FIG. 2) is connected to an input terminal 32*a*-*d* of the selection unit 30. According to other embodiments, only a subset of the output terminals 14*a*-*d* or 56*a*-*d* of the delay line 10 (FIG. 1) or 50 (FIG. 2) are connected to input terminals 32*a*-*d* of the selection unit 30. For example, some of the mutually delayed output signals from the delay line 10 (FIG. 1) or 50 (FIG. 2) may have too short delay, in relation to the period of the input clock signal, to be relevant as input signal to the selection unit 30.

The other input terminal of each AND gate 210*a*-*d* is connected to a unique output terminal 202*a*-*d* of the decode unit 200. The decode unit 200 is arranged to receive the output signal from the control unit 20 via the input port 34 of the selection unit 30. Furthermore, the decode unit 200 is adapted to set one of its output signals, which are supplied to the AND gates 210*a*-*d*, to '1' and the other output signals to '0' based on the output signal from the control unit 20. Thereby, the output signal of one of the AND gates 210*a*-*d*, i.e. the one that receives the '1' from the decode unit 200, follows the mutually delayed output signal from the delay line 10 (FIG. 1) or 50 (FIG. 2) which is input to that AND gate. The output signals from the other AND gates 210*a*-*d* are set to '0'. The logic block 220 is arranged to combine the output signals from the AND gates 210*a*-*d* and generate the delayed clock signal on the output terminal 36 of the selection unit 20. In FIG. 3, the logic block 220 is adapted to perform an OR function, whereby the output signal from the logic block follows the output signal from the one of the AND gates 210*a*-*d* that receives the '1' from the decode unit 200.

As is apparent from the description above, the decode unit 200 may be adapted to select one of the mutually delayed output signals from the delay line 10 or 50 based on the output signal from the control unit 20. The AND gates 210*a*-*d* together with the logic block 220 forward the selected one of said mutually delayed output signal to the output terminal 36 of the selection unit 30. According to some embodiments, other circuitry, such as a multiplexer or the like, may replace the AND gates 210*a*-*d* and the logic block 220.

Figure 6:
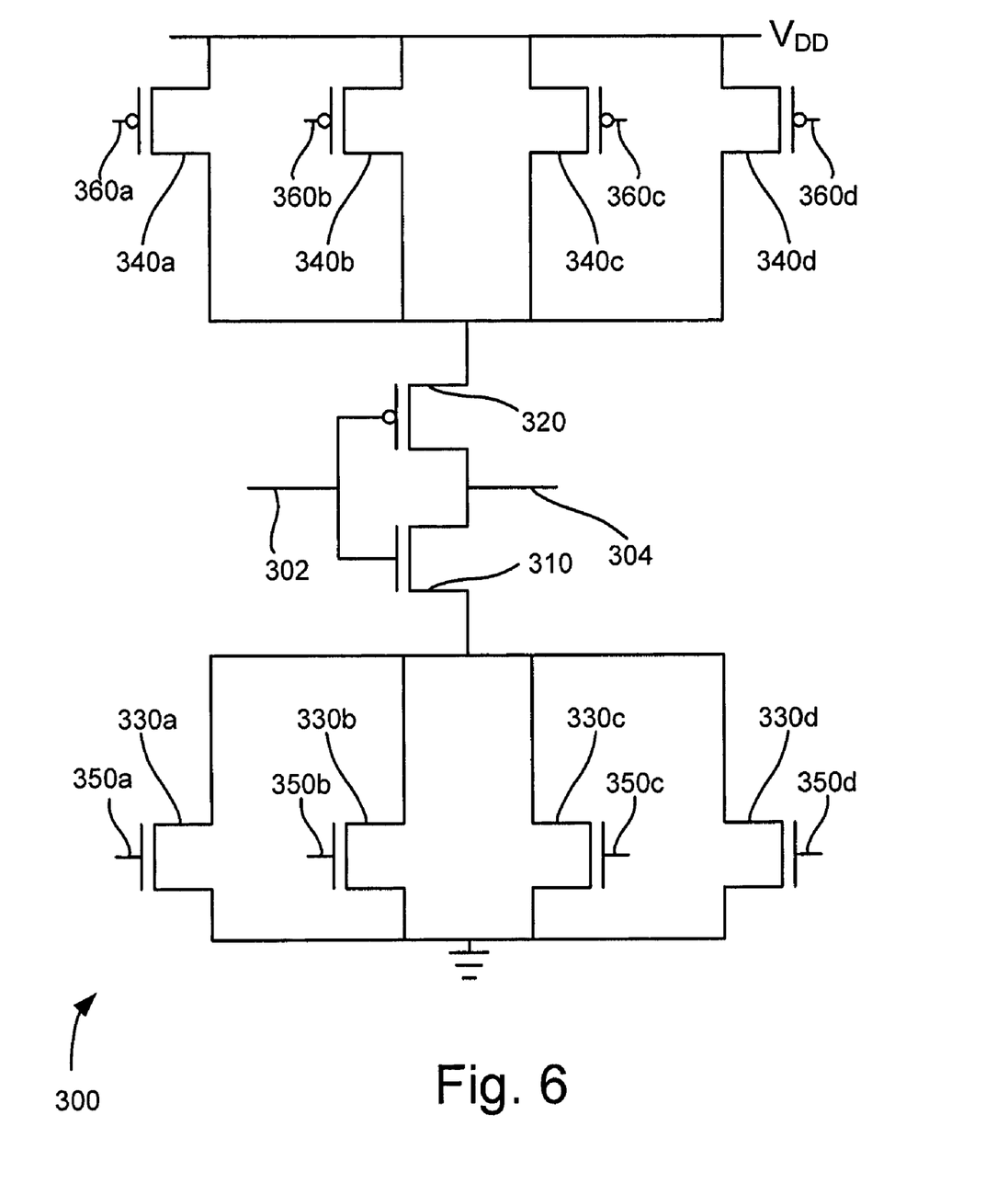
FIG. 6 is a block diagram of an inverter with variable delay according to an embodiment.

As was described in the context of FIG. 2, the duty cycle may, according to some embodiments, be varied by varying a delay of the delay line 50 and/or the delay line 10. FIG. 6 shows a circuit diagram of an inverter 300 with variable rise and fall times according to an embodiment. This type of inverter may e.g. be utilized in delay elements in the delay line 10 and/or 50 for facilitating adjustment of the delay of said delay elements. The inverter 300 has an input terminal 302 and an output terminal 304.

The inverter 300 comprises an NMOS transistor 310 and a PMOS transistor 320 connected with their gate terminals to the input terminal 302 and with their drain terminals to the output terminal 304.

Furthermore, the inverter 300 comprises a plurality of NMOS transistors 330*a*-*d* connected between the NMOS transistor 310 and a ground node of the inverter 300. Similarly, the inverter 300 comprises a plurality of PMOS transistors 340*a*-*d* connected between the PMOS transistor 320 and a supply-voltage node, $V_{DD}$, of the inverter 300.

Each of the NMOS transistors 330*a*-*d* is controlled via a control terminal 350*a*-*d*. By setting the signal input to a control terminal 350*a*-*d* to a logic '1', the corresponding NMOS transistor 330*a*-*d* is enabled, or switched on. By setting the signal input to a control terminal 350*a*-*d* to a logic '0', the corresponding NMOS transistor 330*a*-*d* is disabled, or switched off. By controlling the NMOS transistors 330*a*-*d* via the control terminals 350*a*-*d*, the current available for discharging the output terminal 304 when the input signal to the inverter 300 is '1' can be adjusted. Thereby, the fall time of the inverter 300 can be adjusted.

Similarly, each of the PMOS transistors 340*a*-*d* is controlled via a control terminal 360*a*-*d*. By setting the signal input to a control terminal 360*a*-*d* to a logic '0', the corresponding PMOS transistor 340*a*-*d* is enabled, or switched on. By setting the signal input to a control terminal 360*a*-*d* to a logic '1', the corresponding PMOS transistor 340*a*-*d* is disabled, or switched off. By controlling the PMOS transistors 340*a*-*d* via the control terminals 360*a*-*d*, the current available for charging the output terminal 304 when the input signal to the inverter 300 is '0' can be adjusted. Thereby, the rise time of the inverter 300 can be adjusted.

According to some embodiments, the PMOS transistors 340*a*-*d* are omitted and the source terminal of the PMOS transistor 320 is connected directly to the supply-voltage node $V_{DD}$. Then, only the fall time of the inverter 300 can be adjusted.

According to other embodiments, the NMOS transistors 330a-d are omitted and the source terminal of the NMOS transistor 310 is connected directly to the ground node. Then, only the rise time of the inverter 300 can be adjusted.

The delay of delay elements in the delay line 10 and/or 50 may be varied by adjusting rise and/or fall times for inverters in the delay elements, e.g. as described above. Alternatively or additionally, the delay of delay elements in the delay line 10 and/or 50 may be varied by adjusting load capacitances of the delay elements. Load capacitances may e.g. be adjusted by selectively connecting or disconnecting capacitive elements (not shown in the figures) to/from output terminals of the delay elements or inverters in the delay elements.

In the embodiments illustrated in FIGS. 1 and 2, the input clock signal is input to all of the delay line 10, the delay line 50 (FIG. 2) and the control unit 20. According to some embodiments, the clock signals supplied to these elements 10, 50, 20 may e.g. be supplied from different branches of the same clock distribution network and/or clock buffers may be introduced between the clock terminals 12, 24, 52 of the elements 10, 20, 50. Any mutual delay between the clock signals input to the elements 10, 20, 50 may e.g. be compensated for by properly adapting the functionality of the selection unit 30 in order to achieve the desired functionality of the clock-signal generating unit 1a or 1b. Appropriate adaptation of the functionality of the selection unit 30 may e.g. be derived through simulation in a circuit simulator and/or through measurements.

Figure 7A:
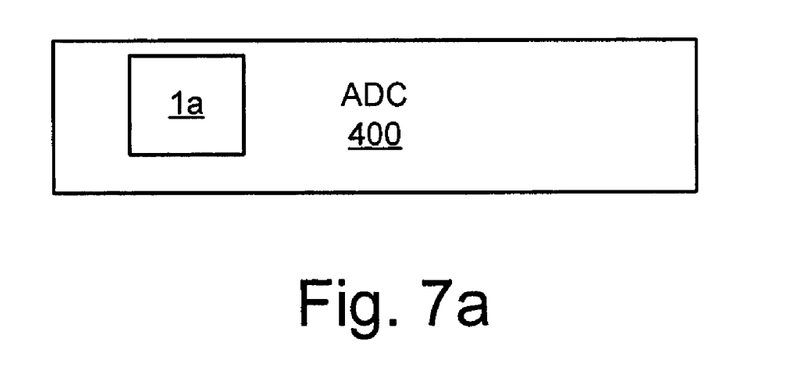
FIGS. 7a-c illustrate schematically an analog-to-digital converter, an integrated circuit, and an electronic apparatus according to embodiments.

According to some embodiments, an analog-to-digital converter (ADC) may comprise one or more of the clock-signal generating unit 1a and/or the clock signal generating unit 1b. This is schematically illustrated in FIG. 7a, showing an ADC 400 comprising the clock-signal generating unit 1a. As a nonlimiting example, the output clock signal from the clock-signal generating unit 1a or 1b may be utilized in the ADC to control reset operations of one or more resettable comparators in the ADC.

Figure 7B:
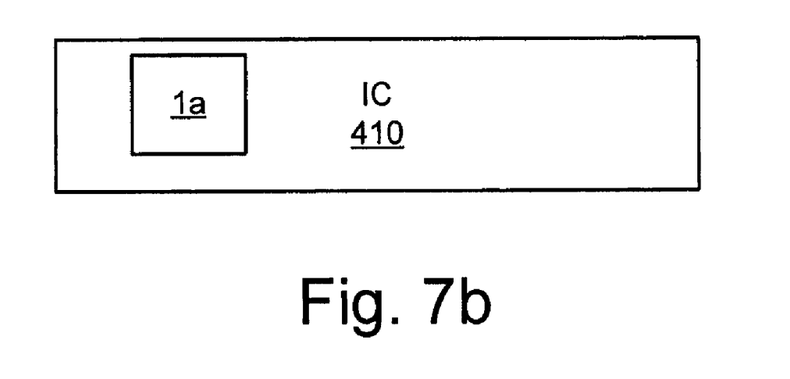

According to some embodiments, an integrated circuit (IC) may comprise one or more of the clock-signal generating unit 1a and/or the clock signal generating unit 1b. This is schematically illustrated in FIG. 7b, showing an IC 410 comprising the clock-signal generating unit 1a.

Figure 7C:
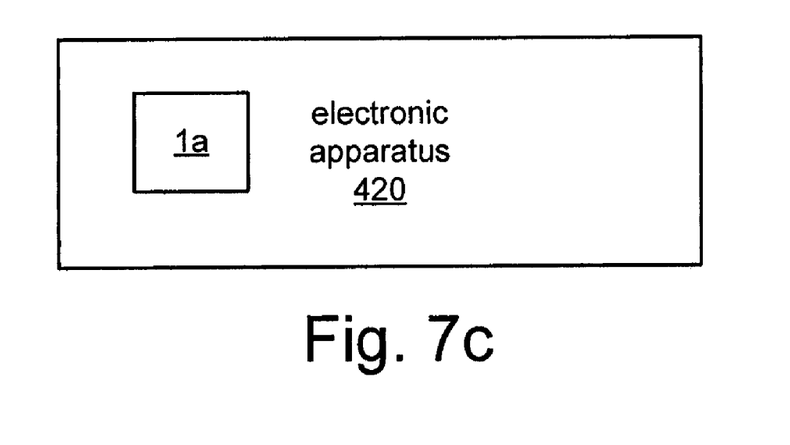

According to some embodiments, an electronic apparatus may comprise one or more of the clock-signal generating unit 1a and/or the clock signal generating unit 1b. This is schematically illustrated in FIG. 7c, showing an electronic apparatus 420 comprising the clock-signal generating unit 1a. As nonlimiting examples, the electronic apparatus may comprise an ADC and/or integrated circuit that in turn comprises one or more of the clock-signal generating unit 1a and/or the clock signal generating unit 1b. The electronic apparatus may e.g. be, but is not limited to, a television set, a liquid-crystal display, a computer monitor, a digital camera, a projector, or a radio receiver.

According to an embodiment, a method of generating an output clock signal with a controlled duty cycle based on an input clock signal is provided. The embodiment is illustrated with a flow chart in FIG. 8. According to the method, at least one set of mutually delayed signals is generated based on the input clock signal in step 500. The generation may e.g. be performed by means of the delay line 10 (FIGS. 1 and 2) and/or the delay line 50 (FIG. 2).

Figure 8:
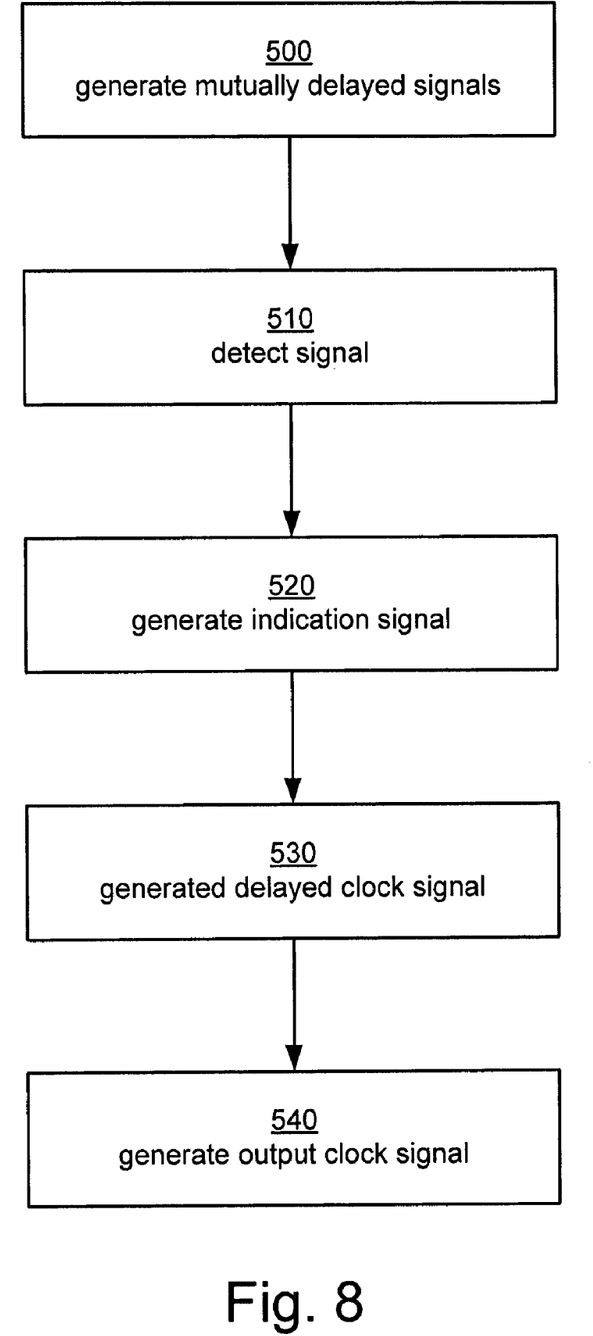
FIG. 8 is a flow chart for a method of generating an output clock signal according to an embodiment.

Furthermore, according to the method, a signal within one of the at least one sets that has a delay, with respect to the input clock signal, that is essentially equal to one period of the input clock signal is detected in step 510. This detection may e.g. be performed by the control unit 20 (FIGS. 1 and 2) by means of detecting a corresponding position within the delay line 10. Moreover, an indication signal that identifies the detected signal is generated 520. The indication signal may e.g. be the output signal of the control unit 20.

In addition, a delayed clock signal is generated that has a delay, with respect to a signal associated with the input clock signal, that is essentially equal to a period of the input clock signal multiplied with said duty cycle based on signals from one of the at least one set and the indication signal in step 530. Said delayed clock signal may e.g. be the delayed clock signal output from the selection unit 30.

According to the method, the output clock signal is generated based on the signal associated with the input clock signal and the delayed clock signal in step 540. The output clock signal may e.g. be generated by the circuitry 40 (FIGS. 1 and 2).

The present invention has been described above with reference to specific embodiments. However, other embodiments than the above described are possible within the scope of the invention. Different method steps than those described above, performing the method by hardware or software or a combination thereof, may be provided within the scope of the invention. The different features and steps of the invention may be combined in other combinations than those described. The scope of the invention is only limited by the appended patent claims.

The invention claimed is:

1. A clock-signal generating unit for generating an output clock signal with a controlled duty cycle based on an input clock signal, comprising
at least one delay line arranged to generate a plurality of mutually delayed output signals at different positions within the delay line based on the input clock signal;
a control unit arranged to detect a position within one of the at least one delay line, the output signal of which has a delay, with respect to the input clock signal, that is essentially equal to one period of the input clock signal, and generate an output signal that indicates the detected position;
a selection unit arranged to generate a delayed clock signal that has a delay, with respect to a signal associated with the input clock signal, that is essentially equal to a period of the clock signal multiplied with said duty cycle based on output signals from one of the at least one delay line and the output signal of the control unit; and
circuitry for generating the output clock signal based on the signal associated with the input clock signal and the delayed clock signal.

2. The clock-signal generating unit according to claim 1, wherein the circuitry for generating the output clock signal is an SR latch arranged to receive the signal associated with the input clock signal on a set input terminal of the SR latch and the delayed clock signal on a reset input terminal of the SR latch.

3. The clock-signal generating unit according to claim 1, wherein the control unit comprises a plurality of D flip-flops, each of the D flip-flops is arranged to receive a unique one of the mutually delayed output signals on a data input terminal and to be clocked with the input clock signal, and the control unit is arranged to generate the output signal that indicates the detected position based on output signals from the D flip-flops.

4. The clock-signal generating unit according to claim 1, wherein the control unit is arranged to detect said position within a first delay line of said at least one delay line and the selection unit is arranged to generate said delayed clock signal based on output signals from a second delay line of the at least one delay line, which is another delay line than the first delay line.

5. The clock-signal generating unit according to claim 1, wherein the control unit is arranged to detect said position within a first delay line of said at least one delay line and the selection unit is arranged to generate said delayed clock signal based on output signals from the same first delay line.

6. The clock-signal generating unit according to claim 1, wherein said duty cycle is a fixed predetermined duty cycle.

7. The clock-signal generating unit according to claim 1, wherein said duty cycle is variable by means of reconfiguring the selection unit.

8. The clock-signal generating unit according to claim 4, wherein said duty cycle is variable by means of varying a delay of the second delay line with respect to a delay of the first delay line.

9. The clock-signal generating unit according to claim 1, wherein said signal associated with the clock signal is the clock signal.

10. An analog-to-digital converter comprising the clock-signal generating unit according to claim 1.

11. An integrated circuit comprising the clock-signal generating unit according to claim 1.

12. An electronic apparatus comprising the clock-signal generating unit according to claim 1.

13. The electronic apparatus according to claim 12, wherein the electronic apparatus is a television set, a liquid-crystal display, a computer monitor, a digital camera, a projector, or a radio receiver.

14. A method of generating an output clock signal with a controlled duty cycle based on an input clock signal, comprising generating at least one set of mutually delayed signals based on the input clock signal;

detecting a signal within one of the at least one sets that has a delay, with respect to the input clock signal, that is essentially equal to one period of the input clock signal;

generating an indication signal that identifies the detected signal;

generating a delayed clock signal that has a delay, with respect to a signal associated with the input clock signal, that is essentially equal to a period of the input clock signal multiplied with said duty cycle based on signals from one of the at least one set and the indication signal; and generating the output clock signal based on the signal associated with the input clock signal and the delayed clock signal.

* * * * *